(12) United States Patent
Gil

(10) Patent No.: US 11,069,876 B2
(45) Date of Patent: Jul. 20, 2021

(54) ORGANIC ELECTROLUMINESCENCE DISPLAY DEVICE AND MANUFACTURING METHOD THEREOF

(71) Applicant: LG Display Co., Ltd., Seoul (KR)

(72) Inventor: Sungsoo Gil, Seoul (KR)

(73) Assignee: LG Display Co., Ltd., Seoul (KR)

( * ) Notice: Subject to any disclaimer, the term of this patent is extended or adjusted under 35 U.S.C. 154(b) by 36 days.

(21) Appl. No.: 16/216,951

(22) Filed: Dec. 11, 2018

(65) Prior Publication Data

US 2019/0207156 A1  Jul. 4, 2019

(30) Foreign Application Priority Data

Dec. 29, 2017 (KR) .................. 10-2017-0184052

(51) Int. Cl.
*H01L 51/52* (2006.01)
*H01L 27/32* (2006.01)
*H01L 51/50* (2006.01)

(52) U.S. Cl.
CPC ........ *H01L 51/5253* (2013.01); *H01L 27/326* (2013.01); *H01L 27/3225* (2013.01);
(Continued)

(58) Field of Classification Search
CPC ............... H01L 51/5253; H01L 27/326; H01L 27/3225; H01L 51/5012; H01L 51/5203;
(Continued)

(56) References Cited

U.S. PATENT DOCUMENTS 8,963,815 B2   2/2015  Park
9,679,949 B2   6/2017  Jung
(Continued)

FOREIGN PATENT DOCUMENTS

JP   2001-290441 A   10/2001
JP   2006-179264 A   7/2006
(Continued)

OTHER PUBLICATIONS

Japan Patent Office, Notice of Reasons for Rejection, JP Patent Application No. 2018-244817, Oct. 29, 2019, eight pages.
(Continued)

*Primary Examiner* — Steven H Loke
*Assistant Examiner* — Juanita B Rhodes
(74) *Attorney, Agent, or Firm* — Fenwick & West LLP

(57) ABSTRACT

An organic electroluminescence display device has a plurality of pixels, each of the pixels including a first portion and a second portion. The first portion has an organic light emitting element and is configured to display images. The second portion is a transparent transmission area through which an external object is visible and includes a foreign substance collecting member. The foreign substance collecting member is made of a ferromagnetic substance and is configured to receive electric current from an external current source through a connecting line and an electric field application pad. When electric current is applied to the electric field application pad, a magnetic field is applied to the foreign substance collecting member, and foreign substance in the first portion is collected by the foreign substance collecting member in the second portion, preventing the foreign substance from being deposited in the first portion.

17 Claims, 11 Drawing Sheets

(52) U.S. Cl.
CPC ...... *H01L 27/3272* (2013.01); *H01L 27/3276* (2013.01); *H01L 51/5012* (2013.01); *H01L 51/5203* (2013.01); *H01L 27/3216* (2013.01); *H01L 2227/323* (2013.01); *H01L 2251/568* (2013.01)

(58) Field of Classification Search
CPC ............. H01L 27/3272; H01L 27/3276; H01L 2227/323; H01L 27/3216; H01L 2251/568; H01L 27/3244; H05B 33/02
See application file for complete search history.

(56) References Cited

U.S. PATENT DOCUMENTS

| | | |
|---|---|---|
| 10,418,428 B2 | 9/2019 | Jung |
| 2010/0155736 A1* | 6/2010 | Yoon ................... H01L 27/1281 257/72 |
| 2012/0280894 A1* | 11/2012 | Park ...................... H01L 27/326 345/77 |
| 2014/0321073 A1 | 10/2014 | Hong et al. |
| 2015/0108455 A1* | 4/2015 | Jung ..................... H01L 27/326 257/40 |
| 2017/0278915 A1 | 9/2017 | Jung |
| 2017/0327942 A1* | 11/2017 | Gao ........................ H01F 41/34 |

FOREIGN PATENT DOCUMENTS

| | | | | |
|---|---|---|---|---|
| JP | 2006179264 A | * | 7/2006 | ......... H01L 51/5259 |
| JP | 2012-234798 A | | 11/2012 | |
| JP | 2015-079758 A | | 4/2015 | |
| KR | 10-2017-0015699 A | | 2/2017 | |

OTHER PUBLICATIONS

Intellectual Property Office of the United Kingdom, GB Patent Application No. 1821143.3, May 22, 2019, six pages.

* cited by examiner

Turn-on image

ORGANIC ELECTROLUMINESCENCE DISPLAY DEVICE AND MANUFACTURING METHOD THEREOF

CROSS-REFERENCE TO RELATED APPLICATION

This application claims the benefit of Republic of Korea Patent Application No. 10-2017-0184052, filed on Dec. 29, 2017, in the Republic of Korea Intellectual Property Office, the disclosure of which is incorporated herein in its entirety.

FIELD OF THE DISCLOSURE

The present disclosure relates to an organic electroluminescence display device and, more particularly, to an organic electroluminescence display device, which can prevent a turn-on defect due to a foreign substance, and a manufacturing method thereof.

DESCRIPTION OF THE RELATED ART

Recently, an electroluminescence device using poly p-Phenylenevinylene (PPV), which is one of a conjugate polymer, had been developed, and a study on organic materials such as the conjugate polymer with conductivity has been actively made since then. Also, a study for applying this organic material to a thin film transistor (TFT), a sensor, a laser, a photoelectric element, etc. has been made, and a study on the electroluminescence display device has been most active among them.

As for an electroluminescence display device made up with a phosphor group inorganic material, a driving voltage higher than or equal to AC 200 V is required, and it is difficult to manufacture a large light emitting element since the light emitting element manufacturing process includes a vacuum deposition step. In particular, the electroluminescence display device made with a phosphor group inorganic material has disadvantages in that it is difficult to generate blue light, and the manufacturing cost is high. On the other hand, the electroluminescence display device made with an organic material has advantages such as a superior light emitting efficiency, facilitation of enlargement of a display size, simplicity of manufacturing processes, and, especially the feasibility of generation of blue light. It is also possible to manufacture a bendable electroluminescence display device. Therefore, the electroluminescence display device made with the inorganic material is widely accepted as a new-generation display device.

In recent years, an active matrix (AM) electroluminescence display device having an active driving element for each pixel, as in the case of the liquid crystal display device, has been widely studied as a Panel Display Device (PDD).

However, this conventional organic electroluminescence display device has several problems as follows. The organic electroluminescence display device is manufactured by depositing an organic light emitting material, a conductive metal oxide, and an insulation material. When a foreign substance is generated in a facility during the deposition process and the foreign substance permeates into the organic light emitting layer or the conductive layer, a deposition defect occurs in the organic light emitting layer or the conductive layer. As a result, a defective organic light emitting layer can be formed or an anode or a cathode can be disconnected, which results in the corresponding area failing to emit light when the organic electroluminescence display device is turned on.

SUMMARY

Embodiments of the present disclosure relate to an organic electroluminescence display device including a substrate including a plurality of pixels, each of the pixels including a first area and a second area. An organic light emitting element is formed on the first area of each of the pixels, the organic light emitting element including a first electrode, a second electrode, and a portion of an organic light emitting layer between the first electrode and the second electrode. A foreign substance collecting member is on the second area, the foreign substance collecting member configured to collect foreign substance during a manufacturing process of the organic electroluminescence display device.

In some example embodiments, the foreign substance collecting member is disposed under another portion of the organic light emitting layer in the second area.

In some example embodiments, the first electrode and the foreign substance collecting member are disposed on a first protective layer covering a driving thin film transistor.

In some example embodiments, an area of the foreign substance collecting member is smaller than or equal to one third of the second area.

In some example embodiments, the first area is a light emitting area in which the light emitting element emits light, and the second area is a transparent transmission area through which an external object is visible.

In some example embodiments, the foreign substance collecting member is arranged along an edge of at least one side of the second area.

In some example embodiments, the first area is a display area configured to display an image, and the second area is a non-display area in which no image is displayed.

In some example embodiments, the foreign substance collecting member is arranged along at least one edge of the non-display area.

In some example embodiments, red, green, and blue subpixels with different areas are arranged in the first area, and no subpixel is arranged in the second area.

In some example embodiments, the foreign substance collecting member is formed with a ferromagnetic substance.

In some example embodiments, a thickness of the foreign substance collecting member is 0.5-10 μm.

In some example embodiments, the foreign substance collecting member is formed with an oxide group ferromagnetic substance or a nitride group ferromagnetic substance.

In some example embodiments, the organic electroluminescence display device includes an electric field application pad configured to receive electric current from an external current source during the manufacturing process of the organic electroluminescence display device, and a connecting line which connects the foreign substance collecting member with the electric field application pad.

Embodiments also relate to a method of manufacturing an organic electroluminescence display device. A driving thin film transistor is formed on a first area of a substrate. A first electrode connected with the driving thin film transistor is formed on the first area of the substrate. A foreign substance collecting member is formed on a second area. At least one of an organic light emitting layer or a second electrode on the substrate is deposited. Foreign substance from the organic light emitting layer and the second electrode is collected by applying a magnetic field to the foreign substance collecting member during the depositing the at least one of the organic light emitting layer and the second electrode.

In some example embodiments, forming the foreign substance is collected by depositing and etching a ferromagnetic substance in the second area of the substrate.

In some example embodiments, the foreign substance includes applying the magnetic field to the foreign substance collecting member through an electric field application pad, and the electric field application pad is disconnected or removed after a protective layer has been formed on the second electrode.

Embodiments also relate to a pixel in an organic electroluminescence display device including a first portion comprising a first electrode, a second electrode, and an organic electroluminescence material between the first electrode and the second electrode, and a second portion including a foreign substance collecting member configured to attract unwanted particulates to prevent the unwanted particulates from accumulating in the first portion during a manufacturing process of the organic electroluminescence display device.

In some example embodiments, the pixel includes a part of a connecting line that connects the foreign substance collecting member to an electric field application pad on a non-display area of the organic electroluminescence display device, electric current received by the foreign substance collecting member during the manufacturing process of the organic electroluminescence display device.

In some example embodiments, the first portion is a light emitting portion, and the second portion is a transparent transmission portion through which an external object is visible.

In some example embodiments, the foreign substance collecting member is arranged along an edge of at least one side of the second portion.

In some example embodiments, the first area is a display portion configured to display an image, and the second portion is a non-display portion in which no image is displayed.

In some example embodiments, red, green, and blue subpixels with different areas are arranged in the first portion and no subpixel is arranged in the second portion.

In some example embodiments, the foreign substance collecting member is formed with a ferromagnetic substance.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF THE DISCLOSURE

Figure 1:
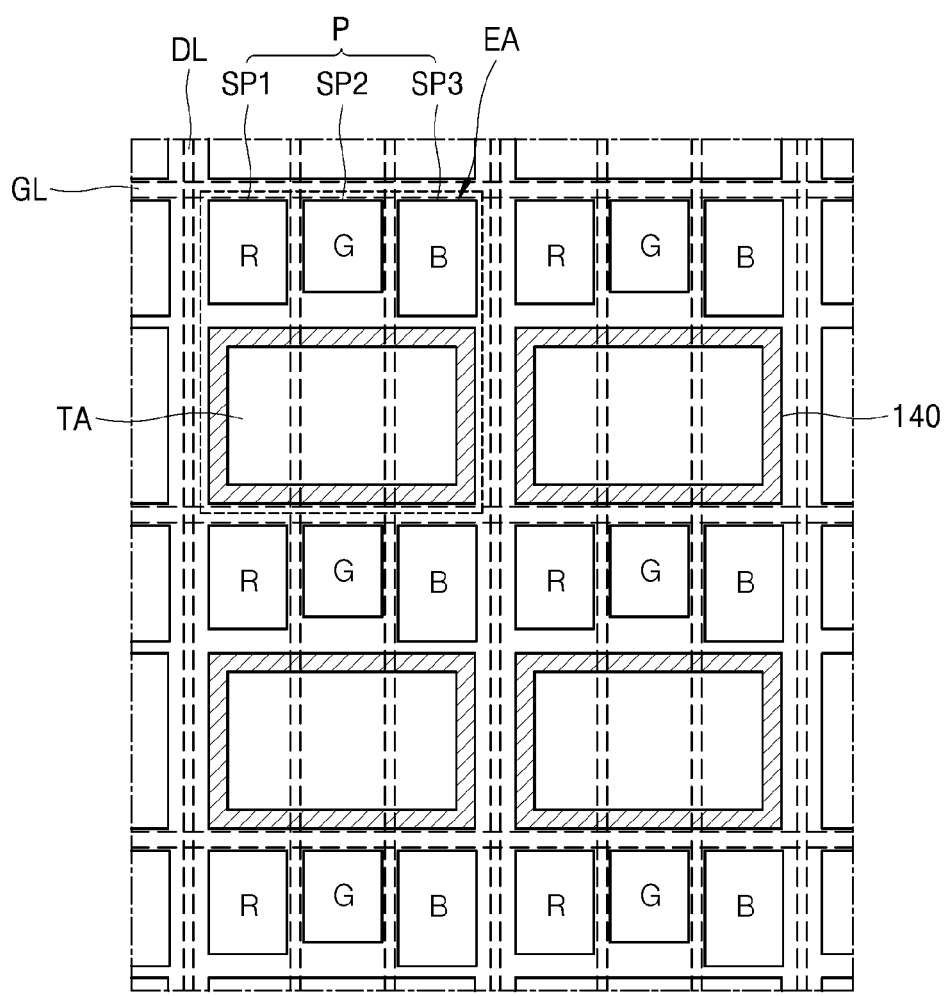
FIG. 1 is a plan view of a transparent organic electroluminescence display device according to a first embodiment of the present disclosure.

The advantages and features of the present disclosure, and a method for accomplishing these will be apparent when referring to the embodiments which are to be described later in detail in connection with the appended drawings. It is to be noted that the present disclosure is not restricted to the embodiments disclosed in the following and can be realized in various different configurations, and the embodiments are provided to fully disclose the present disclosure and help a person with an ordinary skill in the art completely understand the categories of the present disclosure.

Features of various embodiments of the present disclosure can be combined partially or as a whole and they can be technically interconnected in various ways. Also, respective embodiments can be practiced independently of one another or can be practiced together.

Hereinafter, the present disclosure will be described in detail by referring to the appended drawings.

The present disclosure provides an organic electroluminescence display device which prevents a foreign substance (e.g., unwanted particulates) from being attached to a light emitting area of a substrate during a deposition process for the organic electroluminescence display device in order to prevent defects. The easiest way to prevent the foreign substance from being generated during the deposition process is to improve a manufacturing process environment in order to prevent the foreign substance from permeating in advance. The deposition process such as sputtering is performed in a vacuum chamber, and the foreign substance can be generated due to structural characteristics of the vacuum chamber, which results in defective film formation. It is possible to reduce the foreign substance by greatly raising a degree of vacuum in the vacuum chamber. However, a significant cost increase will be required in order to raise the degree of vacuum in the vacuum chamber. In particular, although a moderate cost increase is expected up to a certain degree of vacuum, a great amount of money will be needed to generate a vacuum chamber with a degree of vacuum higher than a preset degree of vacuum. Therefore, the manufacturing cost of the organic electroluminescence display device is increased.

The present disclosure prevents a turn-on defect due to a foreign substance not by preventing the foreign substance, which is generated during a manufacturing process, from permeating inside the organic electroluminescence display device but by preventing the foreign substance, which has permeated inside the organic electroluminescence display device, from playing any role in a function of the organic electroluminescence display device. As a result, a turn-on defect due to a foreign substance can be prevented by simply changing a configuration of the organic electroluminescence display device, rather than by a separate addition or improvement of a manufacturing facility, which prevents a cost increase for the manufacturing facility or the manufacturing cost.

More specifically, although the present disclosure can be effectively applied to a transparent organic electroluminescence display device, the present disclosure can also be applied to an organic electroluminescence display with normal configuration.

FIG. 1 is a plan view of a transparent organic electroluminescence display device according to a first embodiment of the present disclosure. As shown in FIG. 1, a plurality of gate lines GL and data lines DL which respectively extend in a first direction and a second direction, which are perpendicular to each other, to define a plurality of subpixels SP1, SP2, SP3, and a power line (not shown in the figure) which is placed apart from the data lines DL and applies a source voltage are arranged in the transparent organic electroluminescence display device according to the first embodiment of the present disclosure.

The subpixels SP1, SP2, SP3 in the present disclosure constitute one pixel P. More specifically, the transparent organic electroluminescence display device according to the first embodiment of the present disclosure includes a light emitting area EA in which respective subpixels SP1, SP2, SP3 emit light to display an image and a transmission area TA through which the external light is transmitted.

In a non-operating state of the transparent organic electroluminescence display device of this configuration, the light from an object located on the opposite side passes through the transmission area TA, which makes the transmission area transparent. On the other hand, during an operating state, an image is displayed on the light emitting area EA.

Also, in the transparent organic electroluminescence display device according to the present disclosure, it is possible to represent a desired image while an object or an image located on the opposite site is projected on the display device. For example, when the transparent organic electroluminescence display device according to the present disclosure is adopted as a head up display (HUD) for a vehicle or an airplane, it is possible to display driving information of the vehicle or flight information of the airplane on a transparent window at a front portion of the vehicle or the airplane while an external object is projected on the transparent window. Therefore, a driver of the vehicle or a pilot of the airplane can operate the vehicle or the airplane more easily.

The light emitting area EA and the transmission area TA can be formed in similar areas, although the present disclosure is not restricted thereto. The area of the light emitting area EA and the transmission area TA can vary based on an electronic device with which the display device is used. For example, as for a display device which is mainly used in a bright area, the area of the light emitting area EA can be greater than that of the transmission area TA such that an image display function using the light emitting area EA is enhanced. On the other hand, the area of the transmission area TA can be greater than that of the light emitting area EA such that a transparent function using the transmission area TA is enhanced for the display device which is mainly used in dark areas.

Although not explicitly shown in FIG. 1, a switching thin film transistor, a driving thin film transistor, a storage capacitor, a source line, and an organic light emitting element are provided in each of the subpixels SP1, SP2, SP3 in the light emitting area EA.

A white organic light emitting element can be provided in the subpixels SP1, SP2, SP3 of the light emitting area EA such that white light can be emitted. In the meantime, red (R), green (G), and blue (B) color filters can be provided in the subpixels SP1, SP2, SP3 of the light emitting area EA, respectively. Then, the white light outputted from the white organic light emitting display element can be filtered such that a desired color is displayed.

Also, RGB organic light emitting elements, which output red (R), green (G), and blue (B) monochromatic light, respectively, are provided in the subpixels SP1, SP2, SP3 of the light emitting area EA such that a corresponding color is outputted and a desired image is represented.

And, although not shown in the figure, a white (W) subpixel can be provided in the light emitting area EA. The W subpixel transmits the white light, which is outputted from the organic light emitting element, unchanged, and this improves brightness of the organic electroluminescence display device.

As shown in FIG. 1, the RGB subpixels SP1, SP2, SP3 of the light emitting area EA can have different areas; however, some or all of the RGB subpixels SP1, SP2, SP3 can be formed in the same area.

The transmission area TA is a transparent area which is formed at one side of the subpixels SP1, SP2, SP3 and where light incident from outside is transmitted unchanged, and an object on the side from the light is incident is displayed on the transmission area TA as if the transmission area is a transparent window. As described further in the following, the organic light emitting element is provided also in the subpixels SP1, SP2, SP3 of the transmission area TA. However, no signal is applied to the organic light emitting element in the transmission area TA and, therefore, the organic light emitting element in the corresponding area does not emit light and the light incident from outside is transmitted unchanged.

A foreign substance collecting member 140 is provided in the transmission area TA. The foreign substance collecting member 140 is formed with a ferromagnetic substance such that, when a foreign substance is generated during a manufacturing process of the organic electroluminescence display device, the foreign substance collecting member 140 collects the foreign substance which permeates into the light emitting area EA, and no foreign substance remains on various thin films in the light emitting area EA. The foreign substance collecting member 140 is formed in a stripe shape along at least an edge region of the transmission area TA of the pixel P, but the shape is not restricted to the stripe one and the foreign substance collecting member 140 can be formed in various shapes.

A width of the stripe-shaped foreign substance collecting member 140 can be set differently. Since the foreign substance collecting member 140 collects the foreign substance by applying a magnetic field, the width of the foreign substance collecting member 140 should be such that the magnetic field is strong enough to guide the permeating foreign substance during the manufacturing process. Also, since foreign substance collecting member 140 is formed in the transmission area TA as an opaque layer, transmissivity of the transmission area TA is degraded by the foreign substance collecting member 140. Therefore, the width of the foreign substance collecting member 140 should be set such that transparency of the transmission area TA is not degraded too much. Although the width of the foreign substance collecting member 140 can be set between 1 µm and a few tens of micrometers, it is preferred when an area of the foreign substance collecting member 140 is smaller than or equal to that of the area of the transmission area TA.

Since no image is displayed on the transmission area TA, no separate signal is applied to the transmission area TA. Therefore, the image which is displayed transparently is not changed even when the organic light emitting layer in the transmission area TA is defective or the anode/cathode is disconnected due to the foreign substance settling on the transmission area TA. As mentioned above, according to the present disclosure, since the foreign substance is collected in an area which is not affected by the foreign substance, and a defect due to the foreign substance is prevented, a manufacturing facility or a manufacturing environment do not need to be improved. Therefore, the manufacturing cost can be reduced greatly.

In the following, the transparent organic electroluminescence display device according to the first embodiment of the present disclosure is explained in more detail by referring to figures.

Figure 2:
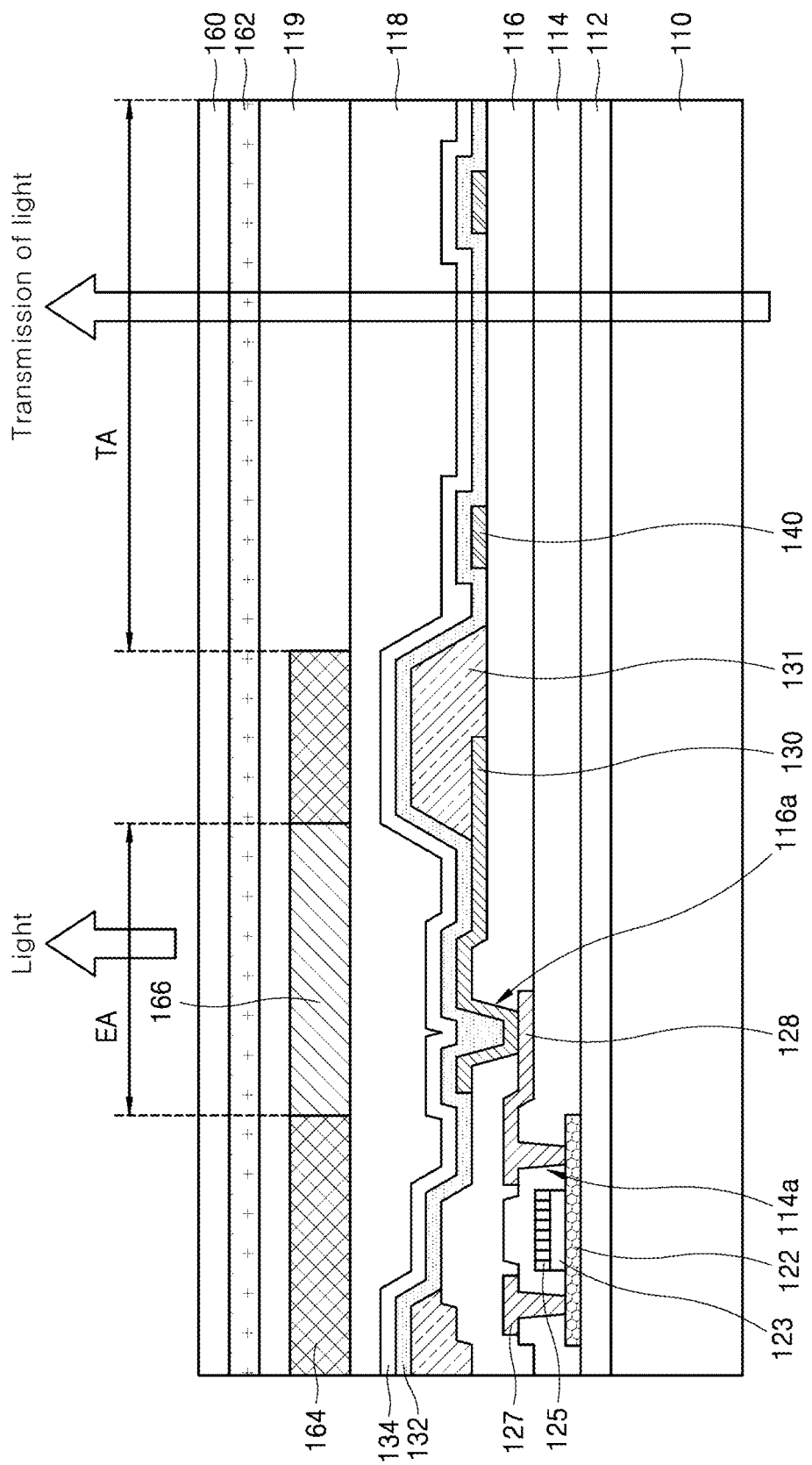
FIG. 2 is a cross-sectional view of the transparent organic electroluminescence display device according to the first embodiment of the present disclosure.

FIG. 2 is a cross-sectional view of the transparent organic electroluminescence display device according to the first embodiment of the present disclosure. In the actual transparent organic electroluminescence display device, a plurality of subpixels are arranged in an n×m matrix shape (here, n and m are natural numbers greater than 1). However, in the figure, a light emitting area EA and a transmission area TA of only one subpixel are shown for the convenience of description.

As shown in FIG. 2, a buffer layer 112 is formed on a first substrate 110 including a light emitting area EA and a transmission area TA, and a driving thin film transistor is arranged on the buffer layer 112. The light emitting area EA is an area where an image is represented by the light emitted from the organic light emitting element while the transmission area TA is a transparent area where the external light is transmitted unchanged and through which an object behind the display device can be seen as if the transmission area TA is a glass window. The substrate 110 is made of a transparent material such as glass; however, a transparent and flexible plastic such as polyimide can be used instead. The buffer layer 112 can be formed with a plurality of layers consisting of a single layer such as SiOx or SiNx, an inorganic layer, and an organic material layer such as photoacryl.

The driving thin film transistor is formed at each of the light emitting areas EA of the subpixels SP. The driving thin film transistor includes a semiconductor layer 122 formed in a pixel on the buffer layer 112. A gate insulation layer 123 is formed on a portion of the semiconductor layer 122, and a gate electrode 125 is formed on the gate insulation layer 123. An interlayer insulation layer 114 is formed over the entire area of the substrate 110 in both of the light emitting area EA and the transmission area TA to cover the gate electrode 125, and a source electrode 127 and a drain electrode 128. The drain electrode 128 touches the semiconductor layer 122 through a first contact hole 114a formed in the interlayer insulation layer 114. The semiconductor layer 122 can touch the source electrode 127 through the first contact hole 114a formed in the interlayer insulation layer 114.

The semiconductor layer 122 can be formed of a semiconductor oxide such as crystalline silicon or indium gallium zinc oxide (IGZO), and includes a channel layer in the center area as well as doped layers at both sides such that the source electrode 127 and the drain electrode 128 touch the doped layer.

The gate electrode 125 can be formed of a metal such as Cr, Mo, Ta, Cu, Ti, Al or Al alloy, etc., and the gate insulation layer 123 and the interlayer insulation layer 114 can be formed in a single layer made of an inorganic insulation material such as SiOx or SiNx or in a double-layer inorganic layer of SiOx and SiNx. Further, the source electrode 127 and the drain electrode 128 can be formed of Cr, Mo, Ta, Cu, Ti, Al or Al alloy.

Although the driving thin film transistor is shown in a specific configuration in the figures and the detailed description, the driving thin film transistor according to the present disclosure is not restricted to the shown configuration; rather, the driving thin film transistor of all configurations can be applied.

A first protective layer 116 is formed in the light emitting area EA and the transmission area TA where the driving thin film transistor is formed. The first protective layer 116 can be formed of an organic material such as photoacryl. A second contact hole 116a is formed in the first protective layer 116.

A first electrode 130, which is electrically connected with the drain electrode 128 of the driving thin film transistor through the second contact hole 116a, is formed on the first protective layer 116 in the light emitting area EA. The first electrode 130 includes a single layer or a plurality of layers which are formed of a metal such as Ca, Ba, Mg, Al, Ag, etc., or an alloy thereof, and it is connected with the drain electrode 128 of the driving thin film transistor such that an image signal is applied thereto from outside.

A bank layer 131 is formed on a boundary between subpixels SP on the first electrode 130. The bank layer 131 serves as a kind of partition and it separates the respective subpixels SP from one another to prevent light of a specific color outputted from adjacent subpixels from being mixed and outputted. Also, the bank layer 131 can be arranged between the light emitting area EA and the transmission area TA of the respective subpixels SP. Although the bank layer 131 is formed on the first electrode 130 in the figure, the bank layer 131 can be formed on the first protective layer 116 and the first electrode 130 can be formed on the bank layer 131.

A foreign substance collecting member 140 is arranged on the first protective layer 116 in the transmission area TA. The foreign substance collecting member 140 is formed in a stripe-shaped pattern with a set width along an outer portion of the transmission area TA of the pixel P. The foreign substance collecting member 140 can be formed by laminating an oxide group or a nitride group ferromagnetic substance using sputtering. The oxide group ferromagnetic substance can include a Co—O group substance or Fe—O substance while the nitride group ferromagnetic substance can include a Co—N group substance or an Fe—N group substance. The foreign substance collecting member 140 can be formed in a thickness of about 0.5-10 μm and a width between 1 μm and a few micrometers.

An organic light emitting layer 132 is formed in the light emitting area EA and the transmission area TA on the first substrate 110. The organic light emitting layer 132 can be an R-organic light emitting layer emitting red light, a G-organic light emitting layer emitting green light, and a B-organic light emitting layer emitting blue light which are formed in the R, G, and B pixels, respectively, and it can also be a white organic light emitting layer which is formed all over the display device to emit white light. When the organic light emitting layer 132 is a white organic light emitting layer, R, G, and B color filter layers are formed on the white organic light emitting layer 132 of the R, G, and B pixels, respectively, and convert the white light emitted from the white organic light emitting layer to red, green, and blue light. The white organic light emitting layer can be formed by mixing a plurality of organic materials, which emit RGB monochromatic light respectively, or by laminating a plurality of organic materials, which emit RGB monochromatic light respectively, one over the other.

The organic light emitting layer can be an inorganic light emitting material which is not an organic light emitting material, e.g., an inorganic light emitting layer made of quantum dots.

Besides the light emitting layers, an electron injection layer and a hole injection layer, which inject electrons and holes into the electronic and hole, respectively, as well as an electron transport layer and a hole transport layer, which transport the injected electrons and holes to the organic layers, respectively, can be formed in the organic light emitting layer 132.

A second electrode 134 is formed on the organic light emitting layer 132. The second electrode 134 can be formed of a transparent material such as indium tin oxide (ITO) or indium zinc oxide (IZO; however, the second electrode is not restricted to these materials.

A second protective layer 118 is formed in the light emitting area EA and the transmission area TA on the second electrode 134. The second protective layer 118 can include an organic layer such as photoacryl, an inorganic layer such as SiOx or SiOx, or a plurality of organic and inorganic layers.

When the organic light emitting layer 132 is a white organic light emitting layer, a black matrix 164 is provided between subpixels SP on the second protective layer 118 and between the light emitting area EA and the transmission area TA within the subpixels SP, and R, G, and B color filter layers 166 are respectively provided in the light emitting area EA on the second protective layer 118.

The black matrix 164 separates adjacent subpixels SP and the light emitting area EA and the transmission area TA of the subpixels SP from each other to prevent light from being mixed from adjacent areas. An opaque metal oxide such as black resin or CrO is commonly used as the black matrix; however, the black matrix is not restricted to these materials.

A third protective layer 119 can be arranged on the color filter layer 166 in the light emitting area EA or on the second protective layer 118 in the transmission area TA. In the meantime, the third protective layer 119 can be formed in a single layer of an organic layer or a plurality of layers such as organic/inorganic layers, or inorganic/organic/inorganic layers.

An adhesive layer 162 is applied on the third protective layer 119 and a second substrate 160 is arranged on the adhesive layer 162 such that the second substrate 160 is attached to the display device. Any material with a strong adhesion force and proper heat resistance and water resistance properties can be used for the adhesive layer. According to the present disclosure, however, a thermosetting resin such as an epoxy group compound, an acrylate group compound or an acryl group rubber can be used. Further, a photopolymer resin can be used as an adhesive, and, in this case, the adhesive layer 162 is cured by irradiating the adhesive layer with light such as an ultraviolet ray.

The adhesive layer 162 not only bonds the first substrate 110 with the second substrate 160, but the adhesive layer also serves as a sealant for preventing moisture from permeating into the electroluminescence display device. Therefore, although the member referred to as 162 in the detailed description of the present disclosure is represented as an adhesive agent, it is only for convenience and the adhesive layer can also be referred to as a sealant.

The second substrate 160 can include a protective film such as a polystyrene film (PS), polyethylene film (PE), polyethylene naphthalate film (PEN) or polyimide film (PI), etc. as well as glass as an encapsulation cap for sealing the electroluminescence display device.

As mentioned above, in the transparent organic light emitting display device according to a first embodiment of the present disclosure, not only the organic light emitting element including the first electrode 130, the organic light emitting layer 132, and the second electrode 134 is formed in the light emitting area EA, but also the color filter layer 166 is formed in the light emitting area EA. Therefore, when a signal is applied, the organic light emitting element emits light and the light of a specific color is transmitted through the color filter layer 166, which results in a desired image displayed on the light emitting area EA.

Meanwhile, not the first electrode 130 but the organic light emitting layer 132 and the second electrode 134 are formed in the transmission area TA. As a result, no signal is applied to the organic light emitting layer 132 in the transmission area TA, even when a signal is applied from outside, which results in no light emission. Furthermore, since the color filter layer 166 is not formed in the transmission area TA, the light received from outside is transmitted unchanged through the transmission area TA, and the transmission area TA makes a back side of the display device appear transparent as a glass window.

In addition, in the transparent organic electroluminescence display device according to the first embodiment of the present disclosure, the foreign substance collecting member 140, which is formed of a ferromagnetic substance, is provided in the transmission area TA such that a turn-on defect due to foreign substances which are generated during a manufacturing process is prevented.

Figure 3A:
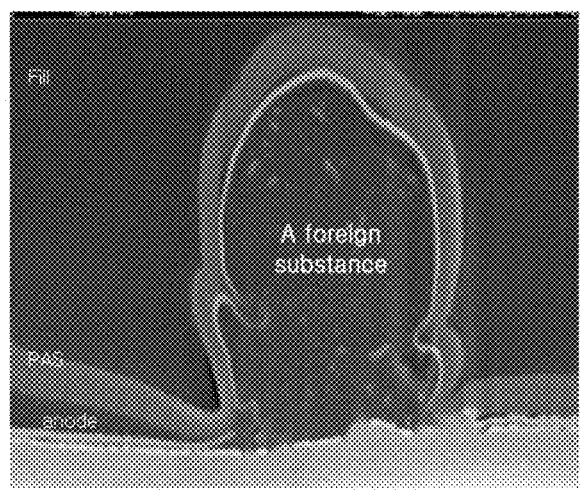
FIG. 3A and FIG. 3B illustrate turn-on defects due to a foreign substance generated during a manufacturing process.
Figure 3B:
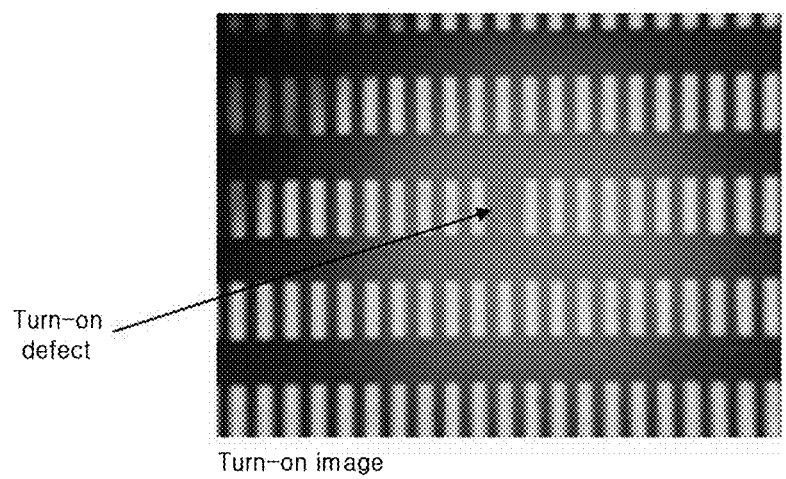

FIG. 3A shows a foreign substance which is generated during a process and permeates into the light emitting area EA during a deposition process. As shown in FIG. 3A, when the foreign substance permeates into a thin film, the organic light emitting layer 132 and the second electrode 134 fail to be directly deposited on the first protective layer 116; rather, they are deposited to cover the foreign substance. Therefore, the deposition of the organic light emitting layer 132 in the corresponding area becomes defective or the second electrode 134 is disconnected. When the second electrode is disconnected, the organic light emitting element in the corresponding subpixel SP cannot be driven and a turn-on defect appears as shown in FIG. 3B.

According to the present disclosure, the foreign substance collecting member 140 collects the foreign substance which is generated during a manufacturing process of the organic electroluminescence display device. The organic electroluminescence display device is manufactured by depositing a metal and an insulation material, etc. on the first substrate 110 in the vacuum chamber, and foreign substances tend to be generated during this vacuum deposition process. The organic electroluminescence display device is manufactured in the vacuum chamber by a semiconductor layer deposition process, a gate electrode/source electrode/drain electrode deposition process, an insulation material deposition process, a first electrode/organic light emitting layer/second electrode deposition process, etc. and these processes are performed in-line in the vacuum chamber.

During the deposition process in the vacuum chamber, deposition materials, etc. are attached to a wall of the vacuum chamber, and the deposition materials, which are attached to the wall, serve as foreign substances in subsequent deposition processes. Especially, since the deposition materials attached to the wall of the vacuum chamber are mainly metallic deposition materials, a metallic foreign substance can appear during subsequent deposition processes.

It is possible to reduce or suppress the generation of the foreign substances up to a certain degree when the degree of vacuum in the vacuum chamber is greatly raised up to an ultrahigh vacuum state. However, the foreign substance cannot be completely suppressed since the generation of the foreign substance originates from the structure itself of the vacuum chamber.

In the present disclosure, vacuum facilities are not improved, but the structure of the organic electroluminescence display device is modified such that the effect of the foreign substance on the quality of the display device is avoided by removing the foreign substance from the light emitting area EA and collecting the foreign substance in the transmission area TA where image is not displayed. In other words, the foreign substance itself which is generated during the manufacturing process is not removed, but the effect of the foreign substance which has permeated into the display device is avoided, which prevents a faulty display device.

In order to remove metallic foreign substances generated within the vacuum facilities, a foreign substance collecting member 140 is made of a ferromagnetic substance according to the present disclosure, such that the foreign substances generated during the manufacturing process are collected in the foreign substance collecting member 140. Since the foreign substance collecting member 140 is not arranged in the light emitting area EA where the organic light emitting layer 132 emits light but in the transmission area TA where the organic light emitting layer 132 does not emit light, defective light emission does not occur in the organic electroluminescence display device even when a thin film in the transmission area TA is defective due to the foreign substance. Also, since the area of the foreign substance collecting member 140 is smaller than or equal to one third of that of the transmission area TA, degradation of transparency of the transmission area TA due to the foreign substance collecting member 140 and the foreign substance collected by the foreign substance collecting member 140 is prevented. Therefore, degradation of transparency of the transparent organic electroluminescence display device can be reduced or avoided.

The foreign substance collecting member 140 is made of a ferromagnetic substance. And, when a magnetic field is generated by applying a current to the foreign substance collecting member 140 during the deposition process, the metallic foreign substance which emerges from the wall of the vacuum chamber is collected by the foreign substance collecting member 140.

The foreign substance collecting member 140 is formed in a patterned shape with a set width along an outer region of the transmission area TA. Although not shown in the figure, the foreign substance collecting member 140 can be connected to an electric field application pad which is formed at an outer region of first substrate 110 through a connecting line. The outer region may be a non-display region along at least one edge of the first substrate 110. During the deposition process for the organic electroluminescence display device, the electric field application pad is connected to an external current source such that the current is applied to the foreign substance collecting member 140. Therefore, an electric field is generated in the foreign substance collecting member 140 which results in collection of foreign substances.

The electric field application pad can be removed by a scribing process and/or a grinding process for the organic electroluminescence display device after depositing the metal and the insulation material on the first substrate 110, or can remain floated.

FIGS. 4A-4E show the organic electroluminescence display device according to the first embodiment of the present disclosure, and a method of manufacturing the organic electroluminescence display device according to the first embodiment of the present disclosure will be described by referring to the figures.

Figure 4A:
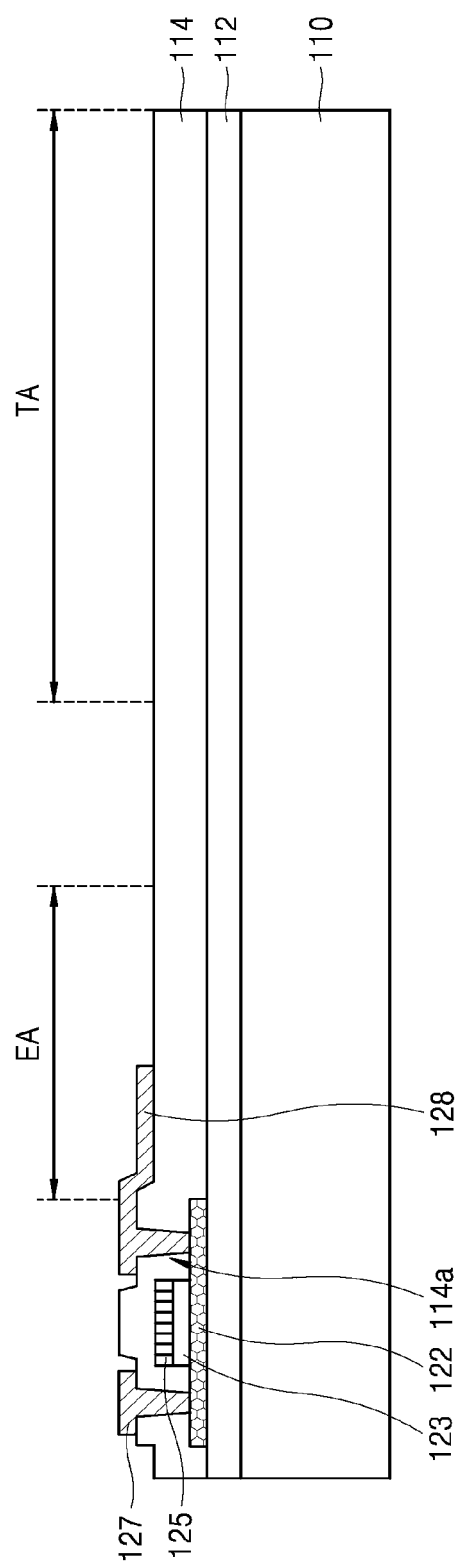
FIGS. 4A-4E illustrate a method of manufacturing the organic electroluminescence display device according to the first embodiment of the present disclosure.

As shown in FIG. 4A, first, an inorganic material such as SiOx or SiNx is laminated all over a first substrate 110, which is made of a material such as glass or plastic and includes a light emitting area EA and a transmission area TA, to form buffer layer 112. The buffer layer 112 can be formed in a single layer or a plurality of layers. Then, a semiconductor oxide or a crystalline silicon, etc. is deposited all over the substrate 110 by using a chemical vapor deposition (CVD) and etched to form a semiconductor layer 122 on the buffer layer 112 in the light emitting layer EA. The crystalline silicon layer can be formed by directly laminating a crystalline silicon, or by laminating an amorphous silicon and then crystallizing the amorphous substance by using various crystallization method such as a laser crystallization method, etc. n+ or p+-type impurities are doped on both sides of the crystalline silicon layer to form a doped layer.

Subsequently, an inorganic insulation material such as SiOx or SiNx is laminated by chemical vapor deposition (CVD) on the semiconductor layer 122, an opaque metal with preferable conductivity such as Cr, Mo, Ta, Cu, Ti, Al or Al alloy, etc. is laminated using a sputtering process, and the inorganic insulation material and the metal are then etched at the same time to form a gate insulation layer 123 and a gate electrode 125 in the light emitting area EA. It is also possible to laminate the gate insulation layer 123 all over the first substrate 110 and then etch the gate insulation layer only to form the gate electrode 125.

Then, an inorganic insulation material is deposited all over the substrate 110 on which the gate electrode 125 is formed by using the CVD process to form an interlayer insulation layer 114 on the light emitting area EA and the transmission area TA. Further, a portion of the interlayer insulation layer 114 is etched to form a first contact hole 114a which is exposed at both sides of the semiconductor layer 122.

After the first contact hole is formed, an opaque metal with preferable conductivity such as Cr, Mo, Ta, Cu, Ti, Al or Al alloy is laminated on by using a sputtering process and then etched such that a source electrode 127 and a drain electrode 128, which are electrically connected with the semiconductor layer 122 through the first contact hole 114a, are formed in the light emitting area EA. As a result, a driving thin film transistor is arranged in the light emitting area EA on the first substrate 110.

Figure 4B:
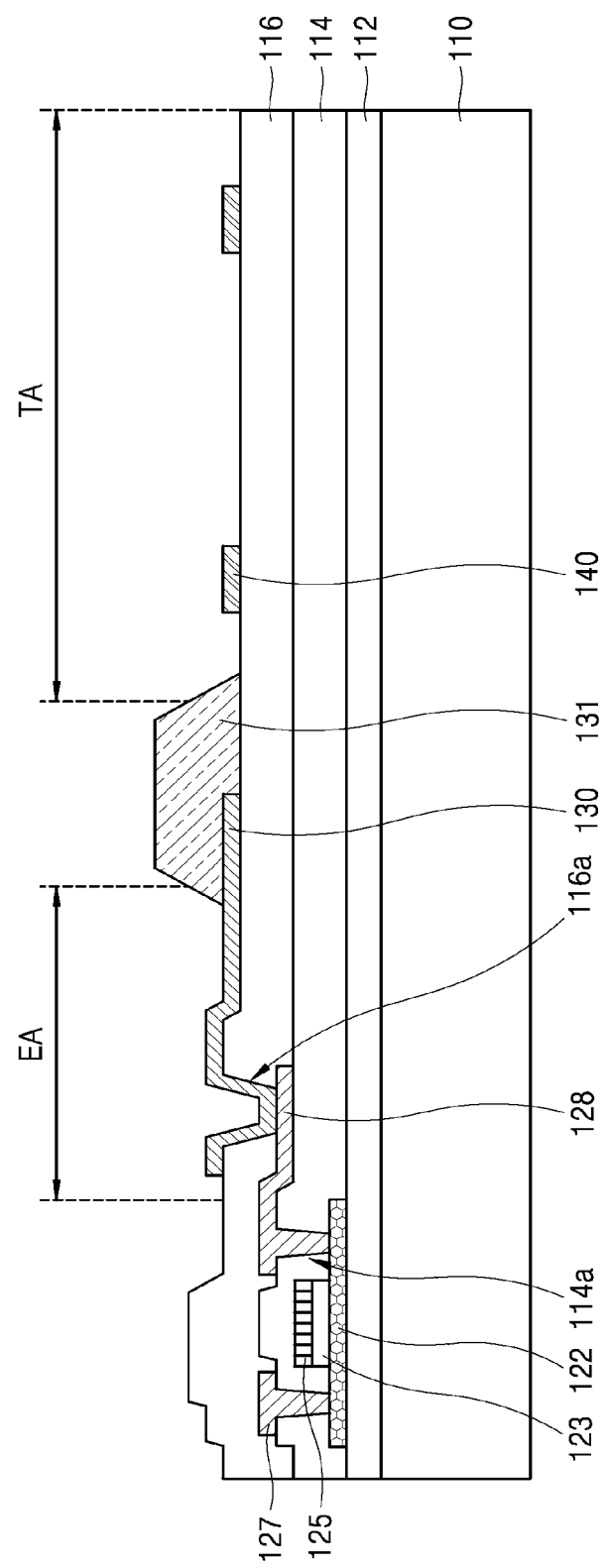

Then, as shown in FIG. 4B, an organic insulation material such as photoacryl is laminated all over the first substrate 110, where the source electrode 127 and the drain electrode 128 are arranged, to form a first protective layer 116, and a portion of the organic insulation material is etched to form a second contact hole 116a through which a drain electrode 128 of the driving thin film transistor is exposed.

After the second contact hole is formed, a metal such as Ca, Ba, Mg, Al, and Ag is laminated all over the first substrate 110 by using the sputtering process, and then etched to form a first electrode 130, which is connected with the drain electrode 128 of the driving thin film transistor through the second contact hole 116a, in the light emitting area EA. A bank layer 131 is then formed in a boundary area of the subpixel SP or in an area between the light emitting area EA and the light transmission area TA. In the meantime, it is possible to form the bank layer 131 before the first electrode 130 is formed.

Also, an oxide group ferromagnetic substance such as a Co—O group substance or an Fe—O group substance or a nitride group ferromagnetic substance such as a Co—N group substance or an Fe—N group substance is deposited on the first protective layer 116 by using a sputtering process while applying a high alternating voltage at an Ar or N2 atmosphere and then etched such that a foreign substance collecting member 140 with a set width is formed in the transmission area TA. On the other hand, the method of forming the foreign substance collecting member 140 is not restricted to the sputtering process; rather, common deposition processes such as physical vapor deposition (PVD) or chemical vapor deposition (CVD) can also be used.

In addition, although not shown explicitly in the figure, a connecting line and an electric field application pad which are connected with the foreign substance collecting member 140 is formed along with the foreign substance collecting member 140.

Figure 4C:
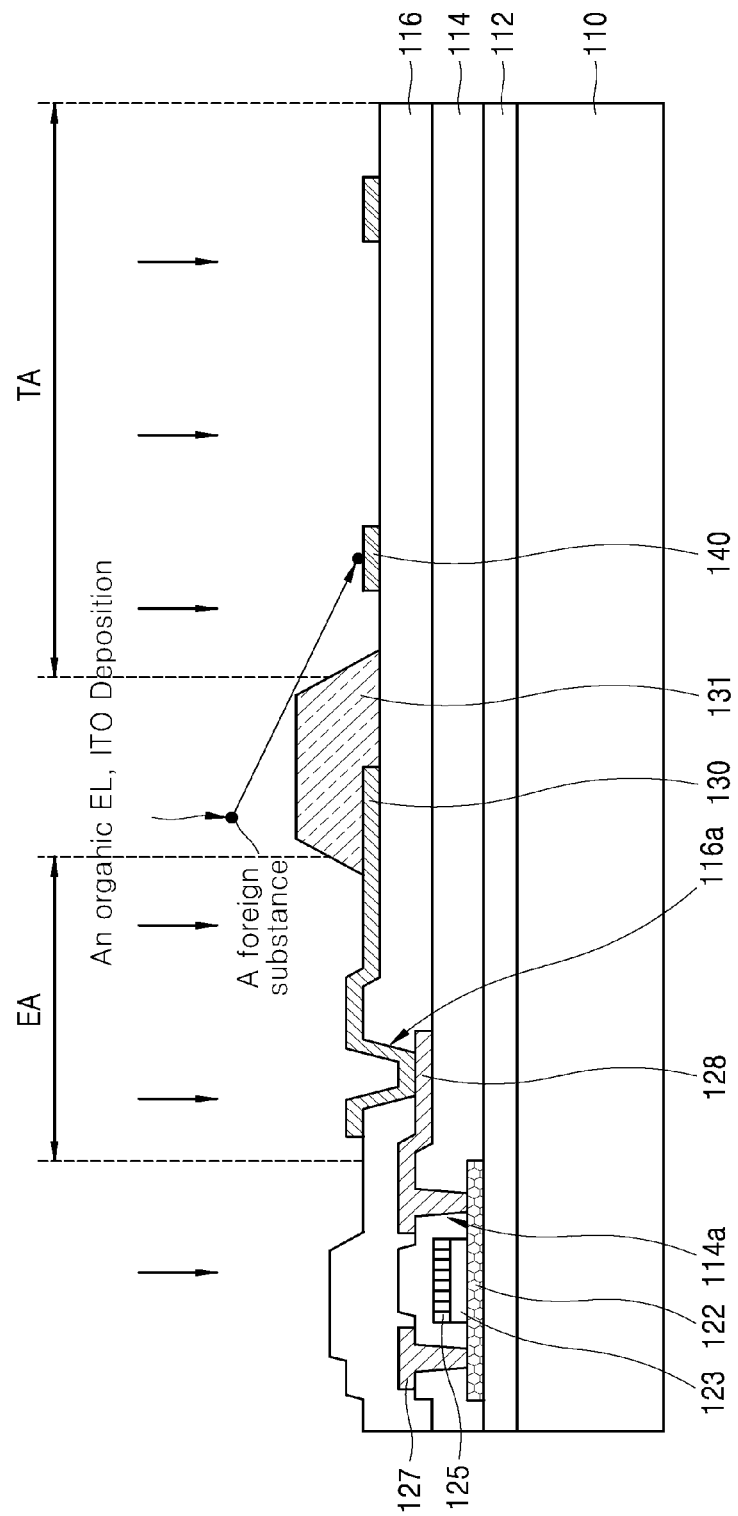

Then, as shown in FIG. 4C, the organic light emitting material, and a transparent metal oxide such as ITO and IZO can be deposited using the sputtering process to form the organic light emitting layer 132 and the second electrode 134. As mentioned above, the current is applied from outside to the foreign substance collecting member 140 to form a magnetic field when the organic light emitting material and the metal oxide are deposited. Therefore, the metallic foreign substance, which emerges from the wall of the vacuum chamber for sputtering and is mixed with the organic light emitting material and the metal oxide to be deposited on the first protective layer 116 in the light emitting area EA, is guided towards the foreign substance collecting member 140 by the magnetic field. As a result, no foreign substance is deposited in the light emitting area EA while the foreign substance is deposited only around the foreign substance collecting member 140 in the transmission area TA.

Figure 4D:
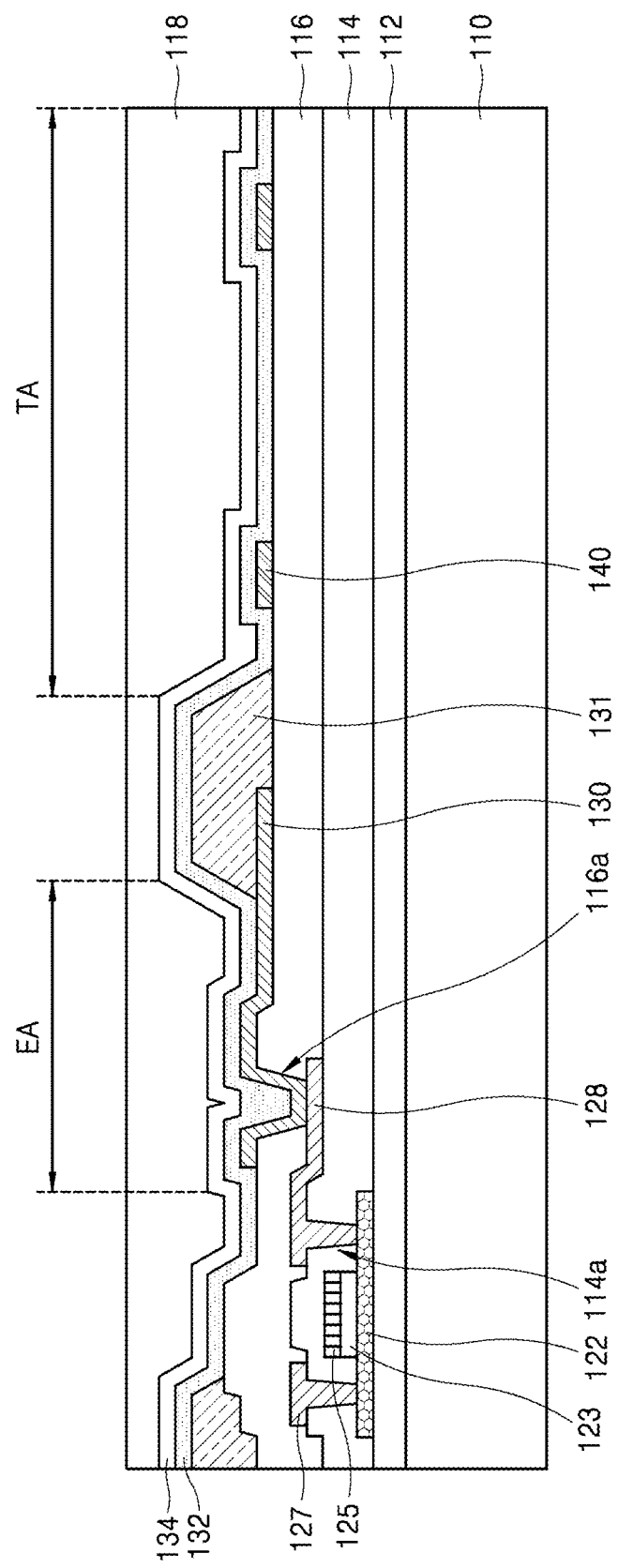

Then, as shown in FIG. 4D, a second protective layer 118 is formed on the organic light emitting element and the collecting member 140.

Figure 4E:
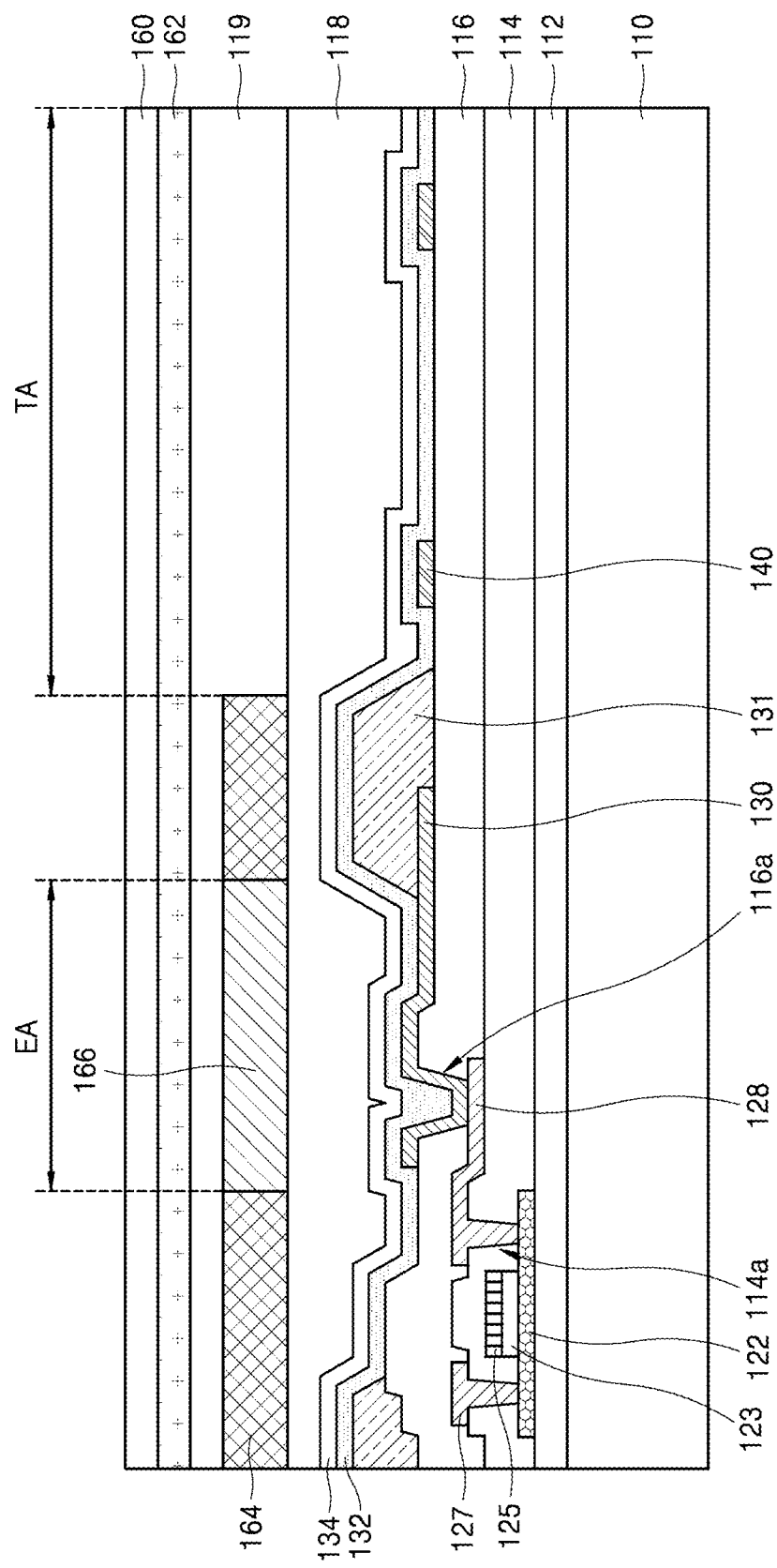

After the second protective layer 118 has been formed, a black matrix 164 is formed on the second protective layer 118, as shown in FIG. 4E, and an RGB color filter layer 166 is formed between sections of the black matrix 164 in the light emitting area EA on the second protective layer 118.

After the black matrix 164 and the color filter layer have been formed, a third protective layer 119 is formed by depositing an organic material and/or an inorganic material on the black matrix 164 and the color filter layer 166 in the light emitting layer EA and on the second protective layer 118 in the transmission area TA, and an adhesive layer 162 is formed by applying an adhesive on the third protective layer 119. Then, a second substrate 160 such as a glass or a film is positioned on the adhesive layer 162, and the adhesive layer 162 is cured while a pressure is applied to complete the organic electroluminescence display device.

Although not shown in the figure, it is possible to further treat the complete organic electroluminescence display device to separate panels from an original wafer or grind an outer region of the panel-based display device.

As explained above, according to the present disclosure, the foreign substance collecting member 140 for collecting a metallic foreign substance during manufacturing process is provided on the transmission area TA where no image according to an image signal input is displayed and whose opposite side is transparent. Therefore, a turn-on defect of the organic electroluminescence display device due to an intrusion of foreign substances is prevented.

Meanwhile, although the transparent organic electroluminescence display device according to the present disclosure is restricted to a specific structure in the above, the present disclosure is not restricted to the organic electroluminescence display device of the specific structure and can be applied to various display devices with different structures. For example, the description above mainly deals with a top emission type display device in which light is outputted upward, the present disclosure can also be applied to a bottom emission type display device where light is outputted downward. Also, in the description above, the organic light emitting layer emits white light and represents an image by using separate R, G, and B color filter layers. However, the present disclosure also can be applied to the organic electroluminescence display device in which the organic light emitting layer consists of organic light emitting layers emitting monochromatic light and no separate color filter layer is provided.

Figure 5:
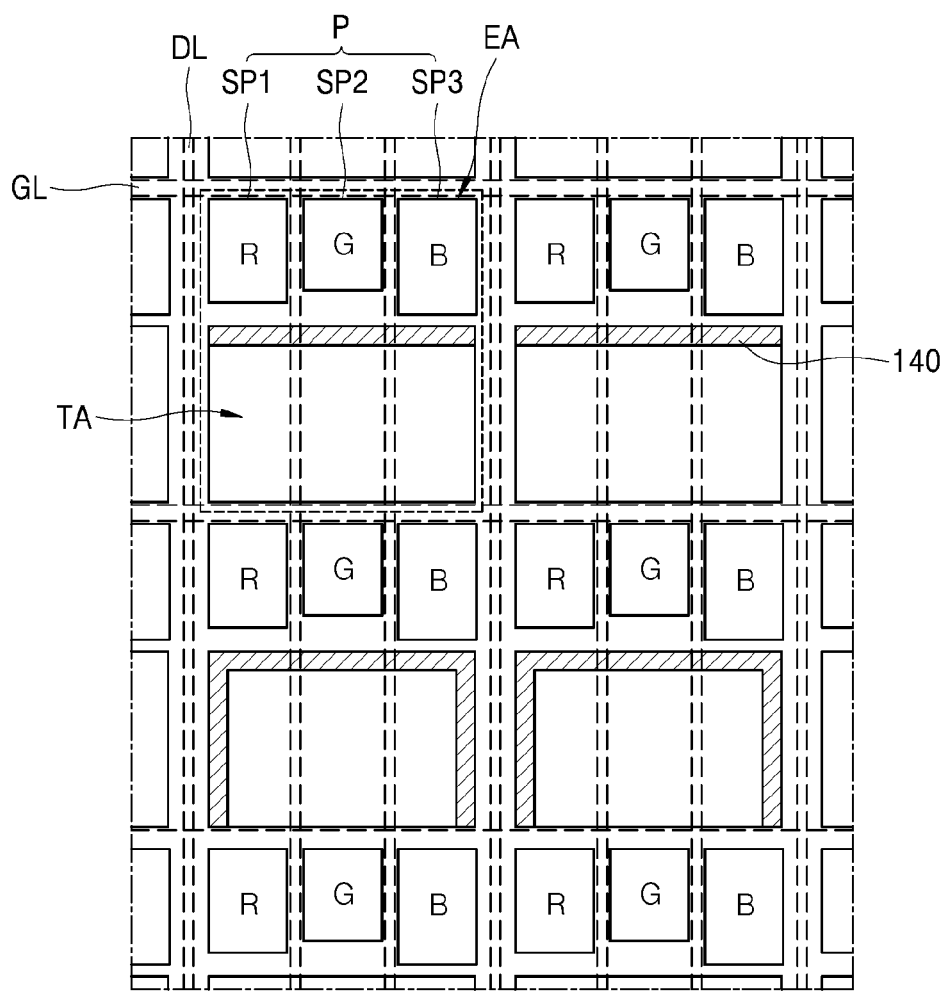
FIG. 5 is a plan view illustrating a further configuration of the transparent organic electroluminescence display device according to the first embodiment of the present disclosure.

Also, although the foreign substance collecting member 140 is formed to surround the outer region of the transparent area TA, the present disclosure is not restricted to this shape. On the other hand, the foreign substance collecting member can be formed to be arranged in one or both sides of the transparent area TA as shown in FIG. 5.

In other words, the foreign substance collecting member 140 can be formed in various shapes in an area, where the foreign substance permeating into the light emitting area EA when the magnetic field are collected most effectively, e.g. an area of the transmission area TA which is closes to the light emitting area EA, with an area which does not exceed one third of the area of the transmission area TA.

And, although the present disclosure is described with reference to a specific transparent organic electroluminescence display device in the above, the present disclosure is not restricted to the transparent organic electroluminescence display device and can be applied to a generic organic electroluminescence display device which is not transparent.

Figure 6:
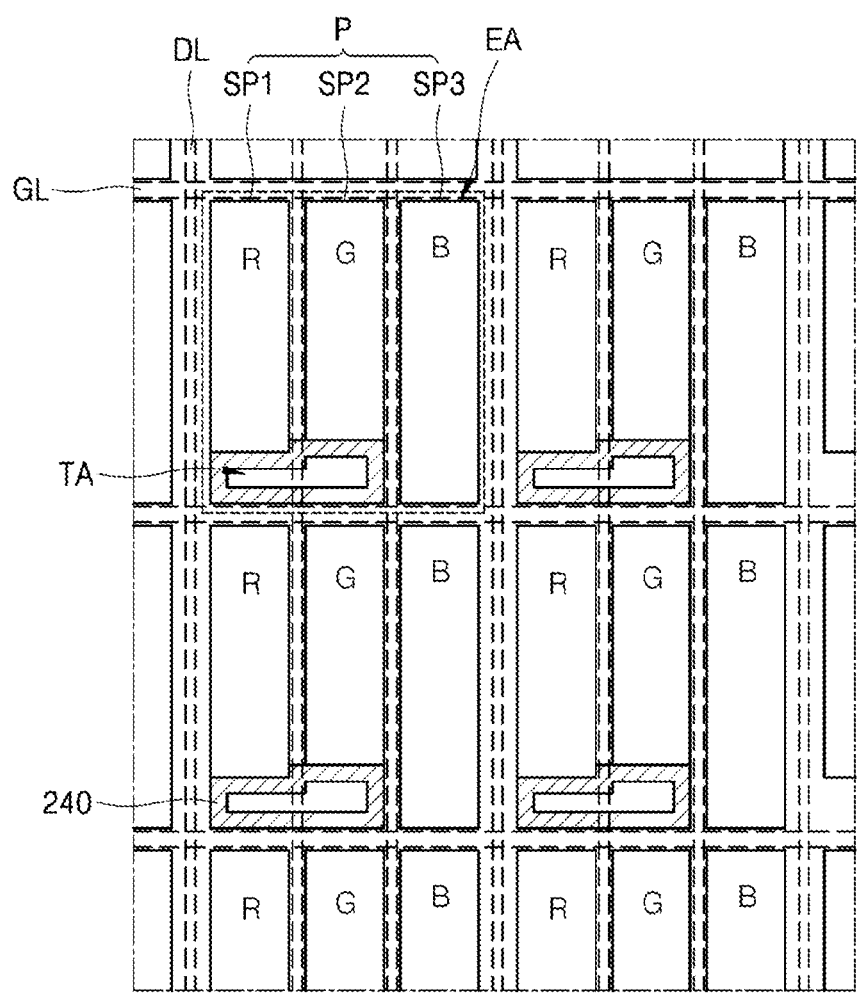
FIG. 6 is a plan view of an organic electroluminescence display device according to a second embodiment of the present disclosure.

FIG. 6 is a plan view illustrating a structure of an organic electroluminescence display device according to a second embodiment of the present disclosure. Here, description on the configuration similar to that of the first embodiment is omitted or simplified, and the description is made only on different configurations.

The organic electroluminescence display device according to the embodiment is an organic electroluminescence display of a generic structure which is not transparent. As shown in FIG. 6, a plurality of gate lines GL and data lines DL which respectively extend in a first direction and a second direction, which are perpendicular to each other, to define a plurality of subpixels SP1, SP2, SP3, and a power line (not shown in the figure) which is placed apart from the data lines DL and applies a source voltage are arranged in the transparent organic electroluminescence display device according to the embodiment of the present disclosure.

The subpixels SP1, SP2, SP3 constitute one pixel P, and more specifically, the organic electroluminescence display device according to the second embodiment of the present disclosure includes a display area DA where respective subpixels SP1, SP2, SP3 emit light to display an image and a non-display area NA where no image is displayed.

As shown in the figure, the pixel P is formed in a rectangular shape, and the subpixels SP1, SP2, SP3 are not formed in the same area. The reason will be as follows.

Generally, the RGB subpixels have different color visibility and brightness. In the meantime, among the R, G, and B subpixels, the color visibility and brightness of the B-subpixel having a color closest to a visible ray wavelength band are the worst, and the color visibility and brightness of the R-subpixel having a color close to an infrared ray are better than that. In addition, the color visibility and brightness of the G-subpixel having a color closest to an ultraviolet ray are the best. Therefore, when the R, G, and B subpixels are formed in the same area, the image quality of the pixel P is degraded due to the difference in the color visibility and brightness of the R, G, and B subpixels SP1, SP2, SP3.

In order to overcome this problem, the R, G, and B subpixels SP1, SP2, SP3 are formed in different areas in order to suppress the difference in the color visibility and brightness of the R, G, and B subpixels SP1, SP2, SP3, which prevents degradation of the image quality of the pixel P. That is, as shown in the figure, the area of the B-subpixel is the largest, and the area of the R-subpixel is next in terms of size, while the area of the G-subpixel is the smallest.

Similarly, since subpixels SP1, SP2, SP3 of different areas are arranged in the pixel P according to the embodiment, there is an area in the pixel P where the subpixels SP1, SP2, SP3 are not formed, and this area is referred to as the non-display area NA. As explained in the following, a black matrix is formed in the non-display area NA such that light leakage into the non-display area NA is prevented and image quality degradation is avoided or reduced.

A foreign substance collecting member 240 is formed in the non-display area NA. The foreign substance collecting member 240 is formed with a ferromagnetic substance such that, when a foreign substance is generated during a manufacturing process of the organic electroluminescence display device, the foreign substance collecting member collects the foreign substance, which permeates into the display area DA, and no foreign substance is deposited on various thin films in the display area DA. The foreign substance collecting member 240 is formed with a set width in a stripe shape along an edge region of the display area DA of the pixel P, but the shape is not restricted to the stripe shape and the foreign substance collecting member 240 can be formed in various shapes. The foreign substance collecting member 240 can be connected to an electric field application pad which is connected to a connecting line. The electric field application pad is configured to apply an electric field to the foreign substance collecting member 240 so that the foreign substance is attracted to the foreign substance collecting member 240 in the non-display area NA.

Since no image is displayed on the non-display area NA, no separate signal is applied to the non-display area NA. Therefore, the image displayed in the display area DA is not affected even when a defective organic light emitting element or a disconnection of an anode/cathode occurs in the transmission area TA due to foreign substance settling in the transmission area TA.

Figure 7:
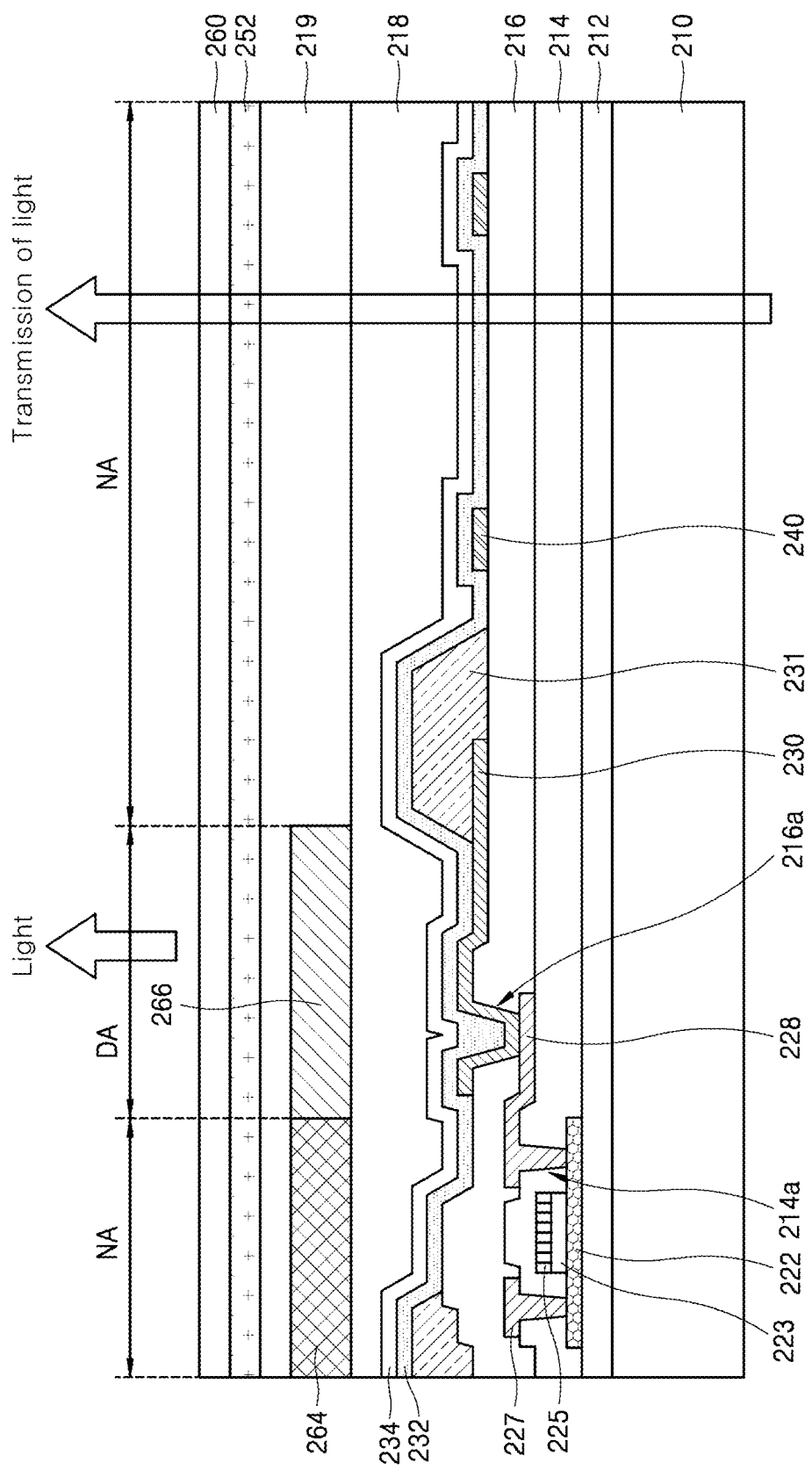
FIG. 7 is a cross-sectional view of an organic electroluminescence display device according to a second embodiment of the present disclosure.

FIG. 7 is a cross-sectional view of an organic electroluminescence display device according to a second embodiment of the present disclosure and illustrates one display area DA and one non-display area NA (where no image is displayed).

As shown in FIG. 7, a buffer layer 212 is formed on a first substrate 210 including a display area DA and a non-display area NA, and a driving thin film transistor is arranged in the display area DA on the buffer layer 212. The driving thin film transistor can include a semiconductor layer 222, a gate insulation layer 223 arranged on the semiconductor layer 222, a gate electrode 225 arranged on the gate insulation layer 223, an interlayer insulation layer 214 formed all over the substrate 210 to cover the gate electrode 225, and a source electrode 227 and a drain electrode 228 arranged on the interlayer insulation layer 214.

Although the driving thin film transistor is shown in a specific configuration in the figures and the detailed description, the driving thin film transistor according to the present disclosure is not restricted to the shown configuration; rather, the driving thin film transistor of all configuration can be applied.

When the driving thin film transistor has been formed, a first protective layer 216 is formed in the display area DA and in the non-display area on the interlayer insulation layer 214, and a first electrode 230, which is electrically connected with the drain electrode 228 of the driving thin film transistor through the second contact hole 216a, is formed on the first protective layer 216 in the display area DA.

A bank layer 231 is formed on a boundary between respective subpixels SP and a boundary between the display area DA and the non-display area NA of each subpixels SP.

Meanwhile, a foreign substance collecting member 240 is arranged on the first protective layer 216 in the non-display area NA. The foreign substance collecting member 240 is formed in a stripe-shaped pattern with a set width along an outer portion of the non-display area NA of the pixel P. The foreign substance collecting member 240 can be formed by laminating an oxide group or a nitride group ferromagnetic substance using sputtering. The oxide group ferromagnetic substance can include a Co—O group substance or Fe—O substance while the nitride group ferromagnetic substance can include a Co—N group substance or an Fe—N group substance.

An organic light emitting layer 232, which includes R, G, and B-organic light emitting layers or a white organic light emitting layer, is formed in the display area DA and the non-display area NA on the first substrate 210.

Besides the light emitting layers, an electron injection layer and a hole injection layer, which inject electrons and holes into the electronic and hole, respectively, as well as an electron transport layer and a hole transport layer, which transport the injected electrons and holes to the organic layers, respectively, can be formed in the organic light emitting layer 232.

A second electrode 234, which is made of ITO or IZO, is formed on the organic light emitting layer 232, and a second protective layer 218, which includes an inorganic layer and/or an organic layer, is formed in the display area DA and the non-display area NA on the second electrode 234.

A black matrix 264 is provided between subpixels SP on the second protective layer 218 and in the non-display area NA within the subpixels SP, and R, G, and B color filter layers 266 are respectively provided in the display area DA on the second protective layer 218.

The black matrix 164 prevents light of a different color from being mixed between adjacent subpixels SP, and blocks transmission of light through the non-display area NA.

A third protective layer 219 can be arranged on the color filter layer 266 in the display area DA or on the second protective layer 218 in the non-display area NA. An adhesive layer 252 is applied on the third protective layer 219 and a second substrate 260 is arranged on the adhesive layer 252 such that the second substrate 260 is attached to the display device.

As mentioned above, the organic light emitting display device according to the second embodiment of the present disclosure includes a display area DA, which includes subpixels of difference areas and where an image is displayed, and a non-display area NA which does not include subpixels and where no image is displayed. In addition, although the organic light emitting layer 232 and the second electrode 234 are formed in the non-display area NA, the first electrode 230 is not formed in the non-display area NA. As a result, no signal is applied to the organic light emitting layer 232 in the non-display area NA, even when a signal is applied from outside, which results in no light emission. Furthermore, since the black matrix 264 is formed in the non-display area NA, light leakage through the non-display area NA is prevented.

In addition, in the organic electroluminescence display device according to the second embodiment of the present disclosure, the foreign substance collecting member 240, which is formed of a ferromagnetic substance, is provided in the non-display area NA such that a turn-on defect due to foreign substances which are generated during a manufacturing process is prevented.

Although numerous details are specifically mentioned in the description above, these are to be construed not as restricting the scope of the present disclosure but as an example of preferred embodiments. Therefore, the present disclosure should not be defined by the described embodiments but by the appended claims and equivalents thereto.

While the present disclosure has been particularly shown and described with reference to exemplary embodiments thereof, it will be understood by those of ordinary skill in the art that various changes in form and details may be made therein within the scope of the appended claims.

What is claimed is:

1. An organic electroluminescence display device comprising:
    a substrate including a plurality of pixels, each of the pixels including a plurality of sub-pixels, each of the plurality of sub-pixels including a first area, each of at least one sub-pixel among the plurality of sub-pixels further including a second area;
    an organic light emitting element formed on the first area of each of the sub-pixels, the organic light emitting element including a first electrode, a second electrode, and a portion of an organic light emitting layer between the first electrode and the second electrode; and
    a foreign substance collecting member on at least a part of the second area included in each of the pixels of the plurality of pixels, the foreign substance collecting member configured to collect foreign substance during a manufacturing process of the organic electroluminescence display device,
    wherein the first area is a light emitting area in which the organic light emitting element emits light, and the second area is a transparent transmission area through which an external object is visible, and
    wherein the foreign substance collecting member is arranged along an edge of at least one side of each of the second areas included in each of the sub-pixels of the plurality of pixels, so that the foreign substance collecting member surrounds a plurality of the second areas included in each of the pixels of the plurality of pixels.

2. The organic electroluminescence display device of claim 1, wherein the foreign substance collecting member is disposed under another portion of the organic light emitting layer in the second area.

3. The organic electroluminescence display device of claim 1, wherein the first electrode and the foreign substance collecting member are disposed on a first protective layer covering a driving thin film transistor.

4. The organic electroluminescence display device of claim 1, wherein an area of the foreign substance collecting member is smaller than or equal to one third of the plurality of second areas included in each of the pixels of the plurality of pixels.

5. The organic electroluminescence display device of claim 1, wherein the first area is a display area configured to display an image, and the second area is a non-display area in which no image is displayed.

6. The organic electroluminescence display device of claim 5, wherein the foreign substance collecting member is arranged along at least one edge of the non-display area.

7. The organic electroluminescence display device of claim 1, wherein red, green, and blue subpixels with different areas are arranged in the first area, and no subpixel is arranged in the second area.

8. The organic electroluminescence display device of claim 1, wherein the foreign substance collecting member is formed with a ferromagnetic substance.

9. The organic electroluminescence display device of claim 8, wherein a thickness of the foreign substance collecting member is 0.5-10 µm.

10. The organic electroluminescence display device of claim 8, wherein the foreign substance collecting member is formed with an oxide group ferromagnetic substance or a nitride group ferromagnetic substance.

11. A method of manufacturing an organic electroluminescence display device comprising:
    forming a driving thin film transistor on a first area of a substrate;
    forming a first electrode connected with the driving thin film transistor, on the first area of the substrate;
    forming a foreign substance collecting member on a second area;
    depositing at least one of an organic light emitting layer or a second electrode on the substrate; and
    collecting a foreign substance from the organic light emitting layer and the second electrode by applying a magnetic field to the foreign substance collecting member during the depositing the at least one of the organic light emitting layer and the second electrode,
    wherein the organic electroluminescence display device comprises a plurality of pixels, each pixel of the plurality of pixels including the first area and the second area,
    wherein the first area is a light emitting area in which the organic light emitting layer emits light, and the second area is a transparent transmission area through which an external object is visible.

12. The method of manufacturing an organic electroluminescence display device of claim 11, wherein forming the foreign substance collecting member includes depositing and etching a ferromagnetic substance in the second area of the substrate.

13. A pixel in an organic electroluminescence display device comprising:
    a plurality of pixels, each pixel of the plurality of pixels including a plurality of sub-pixels,
    wherein each of the plurality of sub-pixels includes a first portion,
    wherein each of at least one sub-pixel among the plurality of sub-pixels further includes a second portion,
    wherein the first portion comprises a first electrode, a second electrode, and an organic electroluminescence material between the first electrode and the second electrode, and the first portion is a light emitting area in which the organic electroluminescence material emits light, and wherein each of the pixels of the plurality of pixels comprises a foreign substance collecting member configured to attract unwanted particulates to prevent the unwanted particulates from accumulating in the first portion during a manufacturing process of the organic electroluminescence display device, and the second portion is a transparent transmission area through which an external object is visible, wherein both the first electrode and the foreign substance collecting member are disposed on a first protective layer covering a driving thin film transistor, and wherein the organic electroluminescence material is disposed on the first electrode, the foreign substance collecting member, and the first protective layer.

14. The pixel of claim 13, wherein the foreign substance collecting member is arranged along an edge of at least one side of the second portion.

15. The pixel of claim 13, wherein the first portion is a display portion configured to display an image, and the second portion is a non-display portion in which no image is displayed.

16. The pixel of claim 13, wherein red, green, and blue subpixels with different areas are arranged in the first portion and no subpixel is arranged in the second portion.

17. The pixel of claim 13, wherein the foreign substance collecting member is formed with a ferromagnetic substance.

* * * * *